United States Patent
Xue et al.

(10) Patent No.: US 10,287,161 B2
(45) Date of Patent: May 14, 2019

(54) STRESS ISOLATION FEATURES FOR STACKED DIES

(71) Applicant: ANALOG DEVICES, INC., Norwood, MA (US)

(72) Inventors: Xiaojie Xue, Bedford, MA (US); Michael J. Zylinski, Haverhill, MA (US); Thomas M. Goida, Windham, NH (US); Kathleen O. O'Donnell, Arlington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 86 days.

(21) Appl. No.: 15/092,234

(22) Filed: Apr. 6, 2016

(65) Prior Publication Data

US 2017/0022051 A1 Jan. 26, 2017

Related U.S. Application Data (60) Provisional application No. 62/196,154, filed on Jul. 23, 2015.

(51) Int. Cl.
*B81B 7/00* (2006.01)
*H01L 25/065* (2006.01)
(Continued)

(52) U.S. Cl.
CPC ........ *B81B 7/0048* (2013.01); *B81C 1/00365* (2013.01); *H01L 23/057* (2013.01);
(Continued)

(58) Field of Classification Search
CPC ... B81C 1/00365; B81B 7/0048; H01L 23/24; H01L 25/0657
See application file for complete search history.

(56) References Cited

U.S. PATENT DOCUMENTS 5,627,407 A 5/1997 Suhir et al.
5,834,848 A * 11/1998 Iwasaki ................. H01L 21/563
257/778

(Continued)

FOREIGN PATENT DOCUMENTS

CN 103253627 A 8/2013
JP H02-78234 3/1990
(Continued)

OTHER PUBLICATIONS

Extended European Search Report dated Dec. 11, 2015, issued in EP Application No. 14199059.8, in 10 pages.

*Primary Examiner* — Phat X Cao
*Assistant Examiner* — Victor Barzykin
(74) *Attorney, Agent, or Firm* — Knobbe, Martens, Olson & Bear LLP (57) ABSTRACT

An integrated device package is disclosed. The package can include a carrier, such as first integrated device die, and a second integrated device die stacked on the first integrated device die. The package can include a buffer layer which coats at least a portion of an exterior surface of the first integrated device die and which is disposed between the second integrated device die and the first integrated device die. The buffer layer can comprise a pattern to reduce transmission of stresses between the first integrated device die and the second integrated device die.

20 Claims, 12 Drawing Sheets

(51) Int. Cl.
*B81C 1/00* (2006.01)
*H01L 23/057* (2006.01)
*H01L 23/00* (2006.01)

(52) U.S. Cl.
CPC ........ *H01L 23/562* (2013.01); *H01L 25/0657* (2013.01); *B81B 2207/115* (2013.01); *B81C 2201/0147* (2013.01); *B81C 2203/0136* (2013.01); *H01L 2225/06575* (2013.01)

(56) References Cited

U.S. PATENT DOCUMENTS

| | | | |
|---|---|---|---|
| 6,084,308 | A | 7/2000 | Kelkar et al. |
| 6,166,434 | A | 12/2000 | Desai et al. |
| 6,184,064 | B1 | 2/2001 | Jiang et al. |
| 6,689,640 | B1 | 2/2004 | Mostafazadeh |
| 6,768,196 | B2 * | 7/2004 | Harney ................ B81B 7/0048 257/729 |
| 7,022,546 | B2 | 4/2006 | Spooner et al. |
| 7,166,911 | B2 * | 1/2007 | Karpman ............. B81B 7/0048 257/669 |
| 7,227,245 | B1 | 6/2007 | Bayan et al. |
| 7,586,178 | B2 | 9/2009 | Manatad |
| 7,615,853 | B2 | 11/2009 | Shen et al. |
| 7,795,725 | B2 | 9/2010 | Mouli et al. |
| 7,893,546 | B2 | 2/2011 | Zhao et al. |
| 7,939,916 | B2 | 5/2011 | O'Donnell et al. |
| 8,324,729 | B2 | 12/2012 | Gupta et al. |
| 8,344,487 | B2 | 1/2013 | Zhang et al. |
| 8,569,861 | B2 | 10/2013 | O'Donnell et al. |
| 8,704,364 | B2 | 4/2014 | Banijamali |
| 9,343,367 | B2 | 5/2016 | Goida et al. |
| 2002/0125550 | A1 | 9/2002 | Estacio |
| 2003/0025183 | A1 | 2/2003 | Thornton et al. |
| 2003/0025199 | A1 | 2/2003 | Wu et al. |
| 2004/0041248 | A1 | 3/2004 | Harney et al. |
| 2005/0093174 | A1 | 5/2005 | Seng |
| 2005/0280141 | A1 | 12/2005 | Zhang |
| 2006/0202319 | A1 * | 9/2006 | Swee Seng ......... H01L 23/3128 257/686 |
| 2007/0075404 | A1 * | 4/2007 | Dimaano, Jr. ...... H01L 23/3107 257/666 |
| 2007/0152314 | A1 | 7/2007 | Manepalli et al. |
| 2007/0205792 | A1 | 9/2007 | Mouli et al. |
| 2008/0203566 | A1 | 8/2008 | Su |
| 2008/0217761 | A1 | 9/2008 | Yang et al. |
| 2009/0147479 | A1 * | 6/2009 | Mori ................... H01L 23/3735 361/699 |
| 2009/0200065 | A1 * | 8/2009 | Otoshi ................. H01L 23/367 174/252 |
| 2011/0074037 | A1 | 3/2011 | Takeshima et al. |
| 2012/0080764 | A1 * | 4/2012 | Xue ..................... B81B 7/0074 257/417 |
| 2012/0098121 | A1 * | 4/2012 | Chen ................... H01L 23/3171 257/737 |
| 2014/0091461 | A1 | 4/2014 | Shen |
| 2014/0103501 | A1 | 4/2014 | Chen et al. |
| 2016/0181169 | A1 | 6/2016 | Huang et al. |

FOREIGN PATENT DOCUMENTS

| | | |
|---|---|---|
| JP | H07-302772 | 11/1995 |
| JP | 2002-134439 | 5/2002 |
| WO | WO 2008/091840 A2 | 7/2008 |
| WO | WO 2010/039855 A2 | 4/2010 |

* cited by examiner

STRESS ISOLATION FEATURES FOR STACKED DIES

CROSS-REFERENCE TO RELATED APPLICATIONS

This application claims priority to U.S. Provisional Patent Application No. 62/196,154, filed on Jul. 23, 2015, the entire contents of which are incorporated by reference herein in their entirety and for all purposes.

BACKGROUND

Field

The field relates to stacked integrated device dies and stress isolations features for stacked integrated device dies.

Description of the Related Art

In various types of packages, two or more integrated device dies can be stacked on top of one another. Stresses can be transmitted between the stacked dies, which can degrade the performance of the package. Accordingly, there remains a continuing need for reducing the transmission of stresses between stacked integrated device dies.

SUMMARY

In one embodiment, an integrated device package is disclosed. The package can include a carrier and an integrated device die mounted to the carrier. A buffer layer can be disposed between the integrated device die and the carrier. The buffer layer can comprise a pattern to reduce transmission of stresses between the carrier and the integrated device die. The pattern can be defined such that there is a gap between a portion of the integrated device die and a portion of the buffer layer.

In another embodiment, a method of manufacturing an integrated device package is disclosed. The method can include depositing a buffer layer on a one of a carrier and an integrated device. The method can further include patterning the buffer layer through at least a portion of a thickness of the buffer layer. The method can also include mounting the integrated device on the carrier such that the buffer layer is disposed between the carrier and the integrated device.

For purposes of summarizing the invention and the advantages achieved over the prior art, certain objects and advantages of the invention have been described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION

Various embodiments disclosed herein relate to stress isolation or reduction features for packages that include an integrated device die stacked or mounted on a carrier, e.g., such as two or more dies that are stacked on top of one another, or an integrated device die stacked on a package substrate. For packages in which a second integrated device die is stacked on a first integrated device die, stresses can be transmitted to the second integrated device die from the first integrated device die. Such transmitted stresses can damage the second die, reducing the performance of the second die. In some packages, an interposer, such as a silicon interposer, can be disposed between the first and second device dies to reduce the transmission of stresses to the second die. However, the use of a silicon interposer (which can comprise a dummy silicon block) can increase the costs of the package by including additional silicon material. Furthermore, thermal mismatch between the first and second dies, or between the dies and other components, can introduce thermal stresses in the second die. Thermal mismatch between the first device die and the package substrate can also cause stresses to be transmitted to the second device die. Moreover, after mounting the package on the larger system substrate (such as a motherboard), if an external load (such as an applied torque or bending load) is applied to the system substrate, the external load can be transmitted to the second integrated device die by way of the first integrated device die.

The transmission of stresses to the second integrated device die can degrade the performance of the package. Accordingly, various embodiments disclosed herein advantageously reduce or prevent the transmission of stresses to a second integrated device die which is stacked on top of another integrated device die. It should be appreciated that the use of the relative terms "top" and "bottom" should not necessarily be construed in the absolute sense. For example, a second die disposed "on top of" a first die may, but need not be, disposed vertically above the first die relative to the force of gravity.

Figure 1:
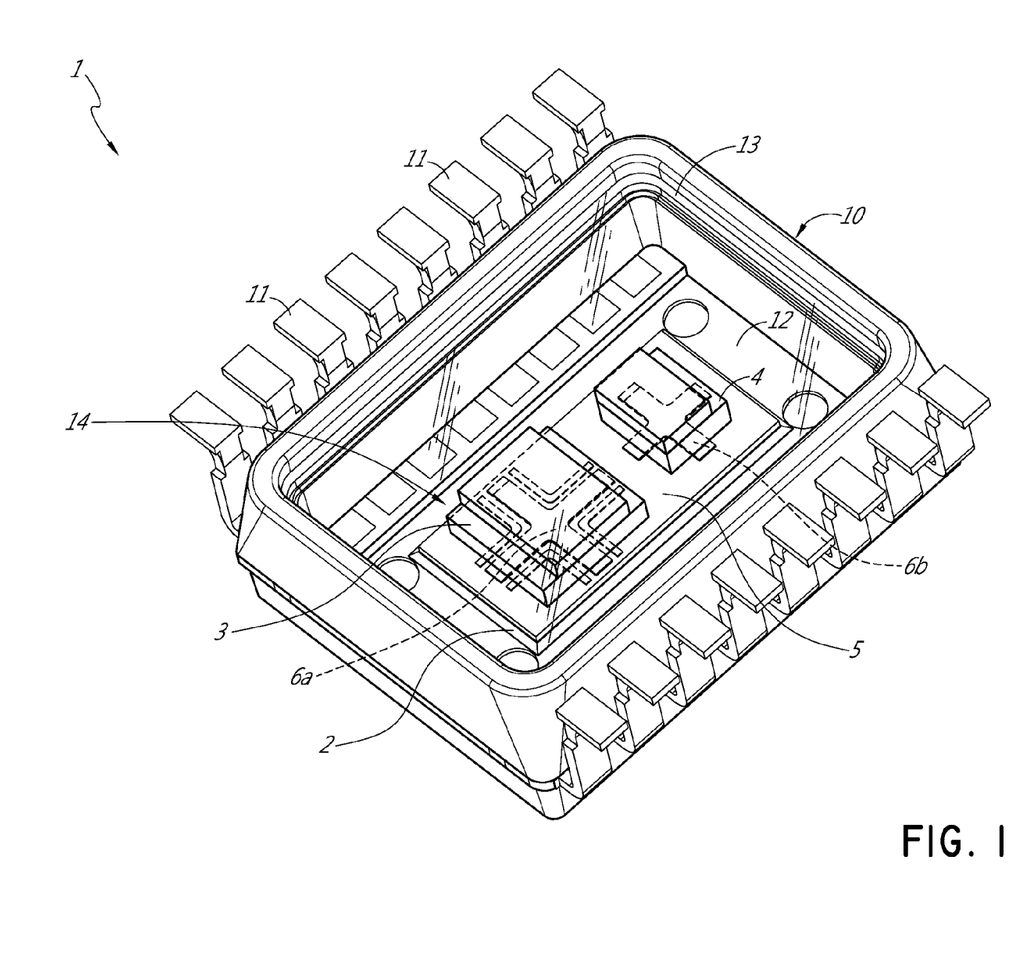
FIG. 1 is a schematic perspective view of an integrated device package, according to one embodiment.
Figure 2:
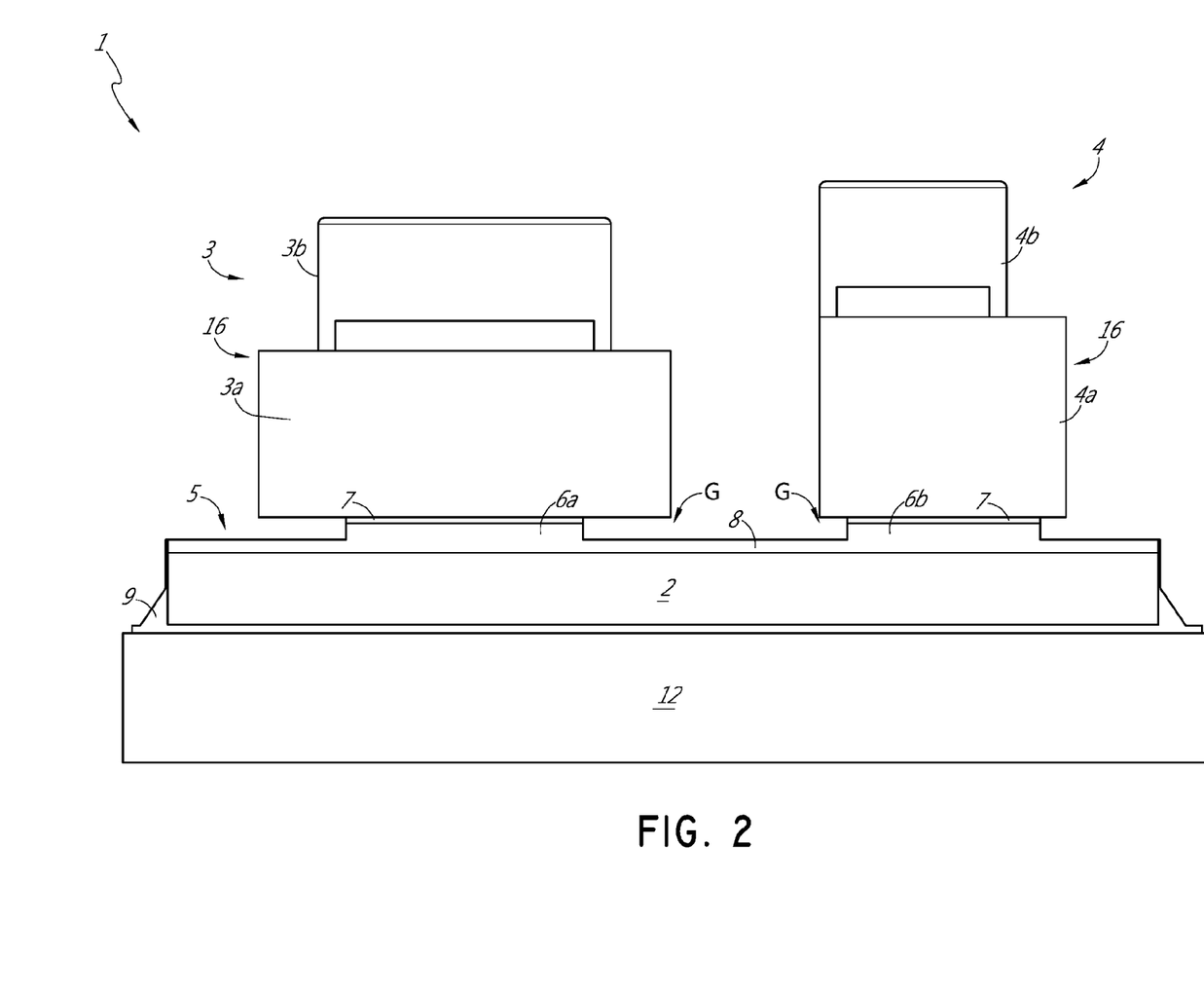
FIG. 2 is a schematic side view of a portion of an integrated device package, in accordance with various embodiments.

FIG. 1 is a schematic perspective view of an integrated device package 1 with a portion of the package removed for ease of illustration, according to one embodiment. FIG. 2 is a schematic side view of a portion of an integrated device package 1, according to various embodiments, such as that shown in FIG. 1. As shown in FIG. 1, the package 1 can include a housing 10 comprising a package substrate 12 and a wall 13 extending about the substrate 12. The substrate 12 shown in FIG. 1 comprises a plastic die mounting pad upon which one or more integrated device dies are mounted. A plurality of electrical leads 11 can be disposed around the substrate 12 to provide electrical communication between the integrated device dies and a larger system motherboard (not shown) which is part of the larger electronic device or system. The housing 10 can be injection molded in the illustrated embodiment to define the electrical leads 11 and the plastic substrate 12. Although the substrate 12 shown in FIG. 1 comprises a molded plastic substrate, any suitable type of substrate may be used in connection with the embodiments disclosed herein. For example, in other embodiments, the substrate 12 can comprise a molded leadframe, a printed circuit board (PCB) substrate with embedded traces and conductors, a ceramic substrate, or any other suitable type of substrate.

As shown in FIG. 1, the housing 10 can comprise or define a cavity 14 in which a first integrated device die 2, a second integrated device die 3, and a third integrated device die 4 can be disposed. It should be appreciated that, although three dies 2-4 are shown in FIG. 1, in other embodiments, more or fewer dies may be used. For example, in other embodiments, only two stacked dies may be employed in the package 1. In still other embodiments, four or more dies may be used. In various embodiments, the first integrated device die 2 can comprise a processor die, such as an Application Specific Integrated Circuit, or ASIC, die. The first die 2 (e.g., ASIC die) can be mounted to the package substrate 12, which as explained above can comprise a plastic substrate (illustrated in FIG. 1), a printed circuit board (PCB), a leadframe substrate, a ceramic substrate, glass or silicon interposer, or any other suitable type of packaging substrate. As shown in FIG. 2, a die attach material 9 (which can be any suitable adhesive, such as an epoxy) can be used to mechanically attach the first die 2 to the package substrate 12. The second integrated device die 3 can be stacked on the first die 2 and electrically connected to the first die 2, e.g., by way of wire bonds or a flip chip connection. In addition, the third integrated device die 4 can also be stacked on the first die 2 and electrically connected to the first die 2, e.g., by way of wire bonds or a flip chip connection. Advantageously, disposing the device dies 2-4 within the cavity 14 can reduce the transmission of stresses from packaging or other components onto active surfaces of the dies 2-4. Although the package 1 shown in FIG. 1 is a cavity package, in other embodiments, the package can comprise an overmolded package in which a filling or encapsulating material may be disposed about portions of the device dies.

The second and/or third integrated device dies 3, 4 can comprise microelectromechanical systems (MEMS) dies, such as a motion sensor die (for example, a gyroscope and/or accelerometer die). A lid or other covering structure (not illustrated in FIG. 1 for ease of illustration) may be provided to enclose the cavity 14 with or without the wall 13 of FIG. 1. The first die 2 can electrically communicate with the second and third dies 3, 4, and can be configured to process signals transduced by the second and/or third dies 3, 4. For example, in various embodiments, the first die 2 can perform pre-processing functions, such as analog-to-digital conversion functions, etc., on the analog signals transmitted from the second and/or third dies 3, 4. In embodiments which utilize inertial motion sensor die(s), e.g., MEMS dies, the motion sensor die can comprise sensitive movable components, such as beams, which can be damaged or warped when subjected to stresses. For example, each of the second and third dies 3, 4 can include corresponding base portions 3a, 4a, within or upon which the sensitive movable components can be formed or defined. Protective cap portions 3b, 4b can be disposed over the movable components of the respective base portions 3a, 4a to protect the sensitive regions of the dies 3, 4.

As explained herein, it can be advantageous to shield or isolate the second and/or third dies 3, 4 (e.g., MEMS motion sensor die(s)) from stresses transmitted from the first die 2 (e.g., an ASIC die). Although the examples disclosed herein relate to MEMS die(s) stacked on an ASIC, it should be appreciated that the first, second, and third device dies 2-4 can be any suitable type of device die, such as processor dies, etc. In various embodiments disclosed herein, a buffer layer 5 can be applied or deposited on at least a portion of an exterior surface of the first integrated device die 2 (e.g., the ASIC) by way of any suitable coating or deposition process (such as spin coating). The buffer layer 5 can advantageously at least partially isolate the second and/or third dies 3, 4 from mechanical stresses transmitted by the first die 1 and/or other components of the package 1 or larger electronic system. The buffer layer 5 can also reduce or eliminate die tilt, which can improve package yield.

Figure 3:
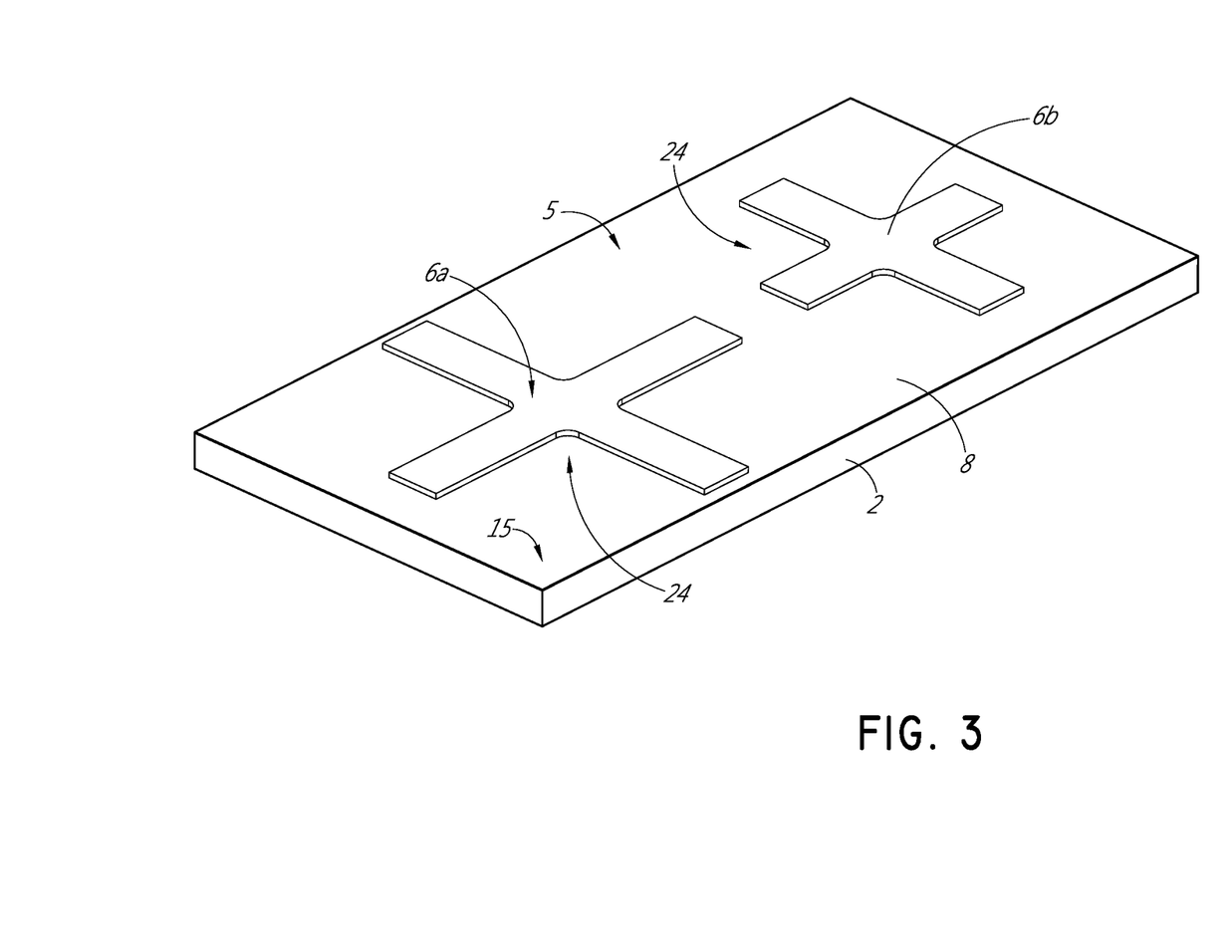
FIG. 3 is a schematic perspective view of a first integrated device die having an example buffer layer coated thereon.

FIG. 3 is a schematic perspective view of the first integrated device die 2 having an example buffer layer 5 coated thereon. The buffer layer 5 can be patterned with suitable techniques (e.g., lithography and etching) to form a suitable buffer pattern on the first die 2. For example, with reference to FIG. 3, the buffer layer 5 can be patterned to define one or more base regions 8 and one or more protrusions 6a, 6b (also referred to as pedestal portions herein) which extend above an uppermost surface 15 of the base region 8. As an example, and as explained below in connection with FIG. 12, an etching or other material removal process may be used to define the protrusions 6a, 6b relative to the base region 8. In other embodiments, the protrusions 6a, 6b and base region 8 can be defined using a molding procedure, a stamping processing, and/or a three-dimensional (3D) printing technique. Thus, as used herein, the base region 8 can extend outwardly from the exterior surface of the first die 2, and the protrusions 6a, 6b or pedestal portions can extend outwardly relative to the uppermost surface 15 of the base region 8. The uppermost surface 15 of the base region 8 can define a recessed region relative to the protrusions 6a, 6b. As shown in FIG. 3, the base region 8 of the buffer layer 5 can extend across the entire or substantially the entire exterior surface of the first die 2. In other embodiments, however, the base region 8 may cover only a portion of the exterior surface of the first die 2. In still other arrangements, the buffer layer 5 disposed between first die 2 and the second and/or third dies 3, 4 can comprise only protrusions, such that the buffer layer does not include any recessed base layer below the protrusions.

Advantageously, the buffer layer 5 can be patterned such that the protrusions 6a, 6b are smaller in lateral extent than the respective second and third dies 3, 4 mounted over the buffer layer 5, such that each of the second and third die 3, 4 overhangs the base regions 8 of the patterned buffer layer 5 with a gap. The second integrated device die 3 and the third integrated device die 4 (e.g., MEMS dies) can be stacked on the first die 2 and mounted to the pedestal portions or protrusions 6a, 6b of the buffer layer 5. For example, a die attach material 7 (FIG. 2), such as an epoxy or other adhesive, can be used to adhere the second and third dies 3, 4 to the protrusions 6a, 6b of the buffer layer 5 and thus to the first die 2.

The buffer layer 5 can have a shape and thickness sufficient to reduce the transmission of stresses from the first die 2 to the second die 3 and/or the third die 4. For example, as explained above, in some embodiments, the second die 3 (and/or the third die 4) can comprise a MEMS motion sensor which has sensitive moveable components mounted at or near corner regions 16 (FIG. 2) of the second die 3 (and/or the third die 4). It can be important to isolate the corner regions 16 from any other components so as to reduce the transmission of stresses to the corner regions. Accordingly, the buffer layer 5 can be patterned such that the corner regions 16 of the second die 3 (and/or the third die 4) do not contact the buffer layer 5 and/or the first die 2. In particular, with respect to the embodiment illustrated in FIG. 3, each of the protrusions 6a, 6b can be patterned in a cross shape such that, when the dies 3, 4 are mounted on the cross-shaped protrusions 6a, 6b, the corner regions 16 of the dies 3, 4 overhang the base region 8 in an overhang area 24, i.e., there is a space or gap G between the corner regions 16 and the buffer layer 5 such that the corner regions 16 do not contact the buffer layer 5 at or near the overhang area 24. Each protrusion 6a, 6b can have a geometric projection onto the exterior surface of the first die 2 which covers less than all the exterior surface of the first die 2. In addition, as explained above with respect to the corner regions 16, the protrusions 6a, 6b do not contact the entire exterior surface of the second and/or third dies 3, 4 in the illustrated embodiments. For example, in some embodiments, the protrusions 6a, 6b or pedestal portions of the buffer layer 5 may contact between 10% and 90% of the exterior surface of the second and/or third dies 3, 4, e.g., between 10% and 40% of the exterior surface of the second and/or third dies 3, 4, or more particularly, between 10% and 30% of the exterior surface of the second and/or third dies 3, 4.

Furthermore, the buffer layer 5 can comprise a material deposited at a thickness which limits or prevents the transmission of stresses between the first die 2 and the second and/or third dies 3, 4. The buffer layer 5 can also reduce die tilt and improve assembly yield. For example, the buffer layer 5 can comprise a polymer or metal. In some embodiments, the buffer layer 5 can comprise a compliant polymer material, such as polyimide or polybenzoxazole (PBO), which advantageously reduce the transmission of stresses to the second and/or third dies 3, 4. The thickness of the buffer layer 5 (i.e., including the total thickness of the protrusions and the base region) can be in a range of 2 microns to 400 microns, e.g., in a range of 35 microns to 300 microns. In some embodiments, the thickness of the buffer layer 5 can be in a range of 5 microns to 100 microns, in a range of 10 microns to 75 microns, in a range of 10 microns to 65 microns, in a range of 20 microns to 55 microns, or in a range of 30 microns to 55 microns. The thickness of the protrusions 6a, 6b above any base layer 8 can be in a range of 10 microns to 80 microns, e.g., in a range of 20 microns to 60 microns, or more particularly, in a range of 30 microns to 50 microns. In some embodiments, the buffer layer 5 can comprise a layer (e.g., a polymer layer) deposited over a wafer of multiple carriers (e.g., multiple integrated device dies) which are subsequently diced or singulated with the buffer layer 5 forming part of the carriers. A separate adhesive can be used to attach an integrated device die to the diced carriers (e.g., a second device die can be attached with an adhesive to the buffer layer 5 of a first device die acting as a carrier). In other embodiments, an adhesive material which attaches the die to the carrier (which may be another device die) may act as the buffer layer and may be suitably patterned.

In the embodiments of FIGS. 1-3, the first integrated device die 2 can act as a carrier upon which the second integrated device die 3 is stacked or mounted. The buffer layer 5 can be applied or coated and patterned on the exterior (top) surface of the first die 2 to prevent or reduce the transmission of stresses to the second die 3. In other embodiments, however, the buffer layer 5 can be applied or coated on the exterior (bottom) surface of the second die 3 to prevent or reduce the transmission of stresses. In still other embodiments, the buffer layer can be disposed between a sensitive device die (such as the second die 3) and a package substrate, such as a molded plastic substrate, a PCB substrate, or leadframe substrate, to prevent or reduce the transmission of stresses from the package substrate to the sensitive die. For example, in such embodiments, the package substrate can act as a carrier, and the buffer layer can be coated and patterned on the exterior surface of the package substrate (or on the exterior surface of the sensitive die).

Figure 4A:
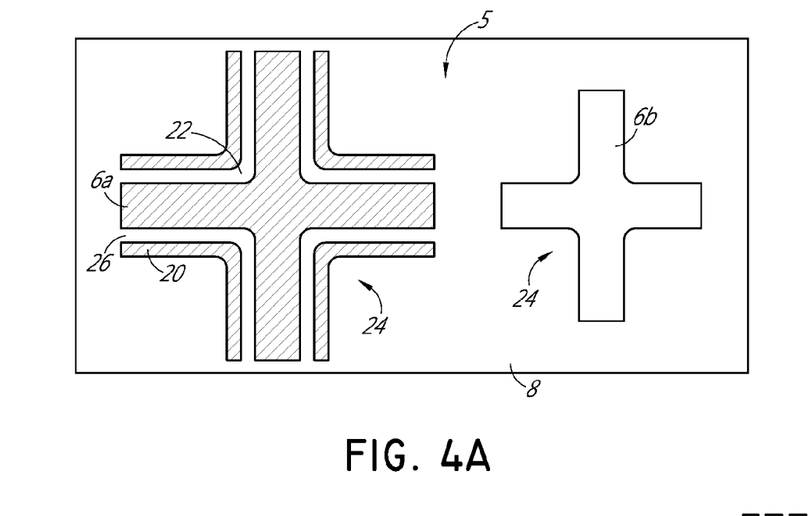
FIGS. 4A-4B are schematic perspective views of a first integrated device die having a buffer layer with a dam portion coated on the first integrated device die.

FIGS. 4A-11 are schematic perspective views of additional examples of a first integrated device die 2 having a buffer layer 5 coated thereon. For example, FIGS. 4A-4B are schematic perspective views of a first integrated device die 2 having a buffer layer 5 with a dam portion 20 coated on the first integrated device die 2. Unless otherwise noted, reference numerals shown in FIGS. 4A-11 represent components which are the same as or similar to those shown in FIGS. 1-3.

Figure 4B:
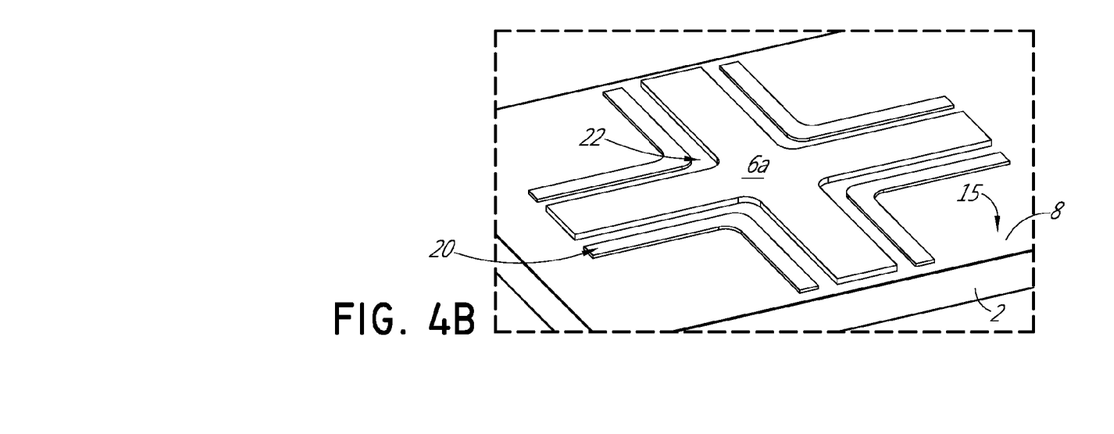

In the embodiment of FIGS. 4A-4B, the patterned buffer layer 5 can comprise pedestal portions or protrusions 6a, 6b which support the second device die and a dam portion 20 which is spaced from at least one of the protrusions 6a. For example, as with FIG. 3, the protrusions 6a, 6b can comprise a cross-shaped protrusion to support the dies 3, 4 such that corner regions 16 of the dies 3, 4 do not contact the buffer layer 5 at or near the overhang areas 24. The dam portion 20 can have a thickness that is less than a thickness of the pedestal portion or protrusion 6a such that the dam portion 20 does not contact and leaves a gap below the lower surface of the second die 3. A channel 22 can be defined between the dam portion 20 and the protrusion 6a. The channel 22 can be open, in which the channel has an open end 26 at the outer perimeter of the first die 2. In other embodiments, however, the channel can be closed, in which the channel has a closed end at the outer perimeter of the first die. Advantageously, the channel 22 can be sized and shaped such that, if the die attach material 7 (FIG. 2) which attaches the second die 3 to the buffer layer 5 bleeds out from between the buffer layer 5 and the second die 3, the die attach material 7 can be confined within the channel 22 and directed as desired, e.g., away from the second die 3, rather than allowing the excess adhesive to fix the corners 16 of the second die 3. Moreover, the dam portion 20 and the protrusion 6a can be defined during the same wafer-level processing techniques, as explained herein with respect to FIG. 12.

Figure 5:
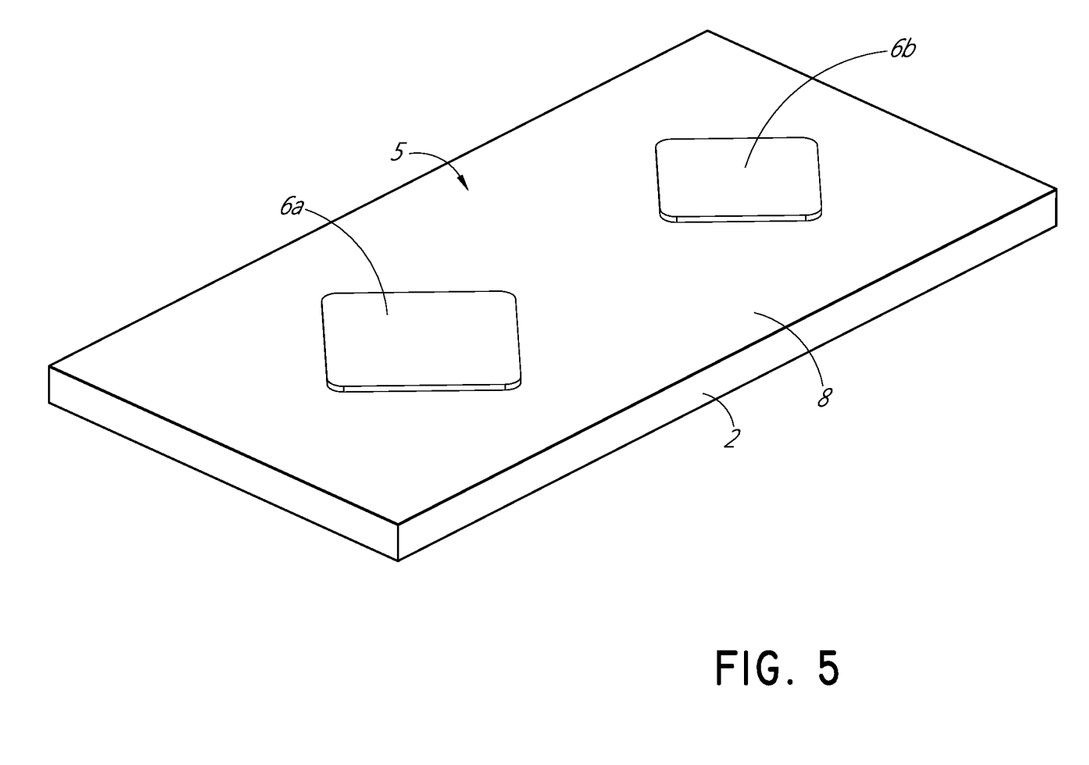
FIG. 5 is a schematic perspective views of a first integrated device die having a buffer layer, according to one embodiment.

FIG. 5 is a schematic perspective views of a first integrated device die 2 having a buffer layer 5 patterned with a polygonal (e.g., four-sided shape), as viewed from a top plan view. For example, as shown in FIG. 5, one or more of the protrusions 6a, 6b can have a diamond-shaped profile. As with the embodiment of FIG. 3, the diamond-shaped protrusions 6a, 6b can be sized so as to enable the corner regions 16 (FIG. 2) of the die 3 or 4 to overhang the base region 8 of the buffer layer 5.

Figure 6A:
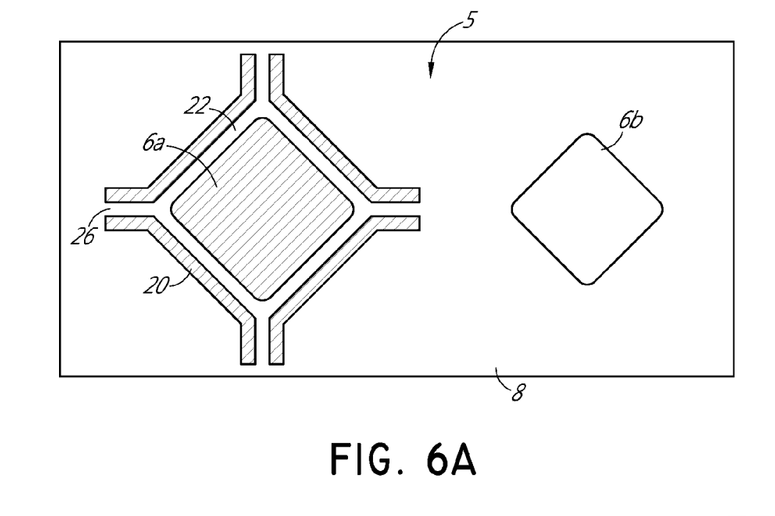
FIGS. 6A-6B are schematic perspective views of a first integrated device die having a buffer layer patterned with a protrusion and a dam portion which is disposed about at least a portion of a perimeter of one of the protrusions.
Figure 6B:
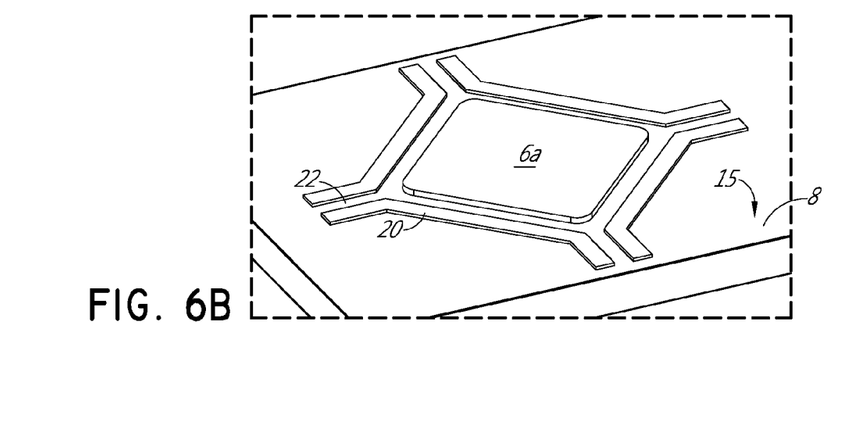

FIGS. 6A-6B are schematic perspective views of a first integrated device die 2 having a buffer layer 5 patterned with a four-sided protrusion 6a, 6b and a dam portion 20 which is disposed about at least a portion of a perimeter of one of the protrusions 6a. Unless otherwise noted, reference numerals shown in FIGS. 6A-6B represent components which are the same as or similar to those shown in FIGS. 1-5. For example, as with the embodiment of FIGS. 4A-4B, in the embodiment of FIGS. 6A-6B, the dam portion 20 can be spaced from at least one of the protrusions 6a so as to define a channel 22 through which the die attach material 7 (see FIG. 2) can flow in the event of epoxy bleedout, to prevent any excess adhesive from fixing the corners 16 of the second die 3. As with the embodiment of FIGS. 4A-4B, the channel 22 can have an open end 26 to enable the die attach material 7 to flow therethrough.

Figure 7:
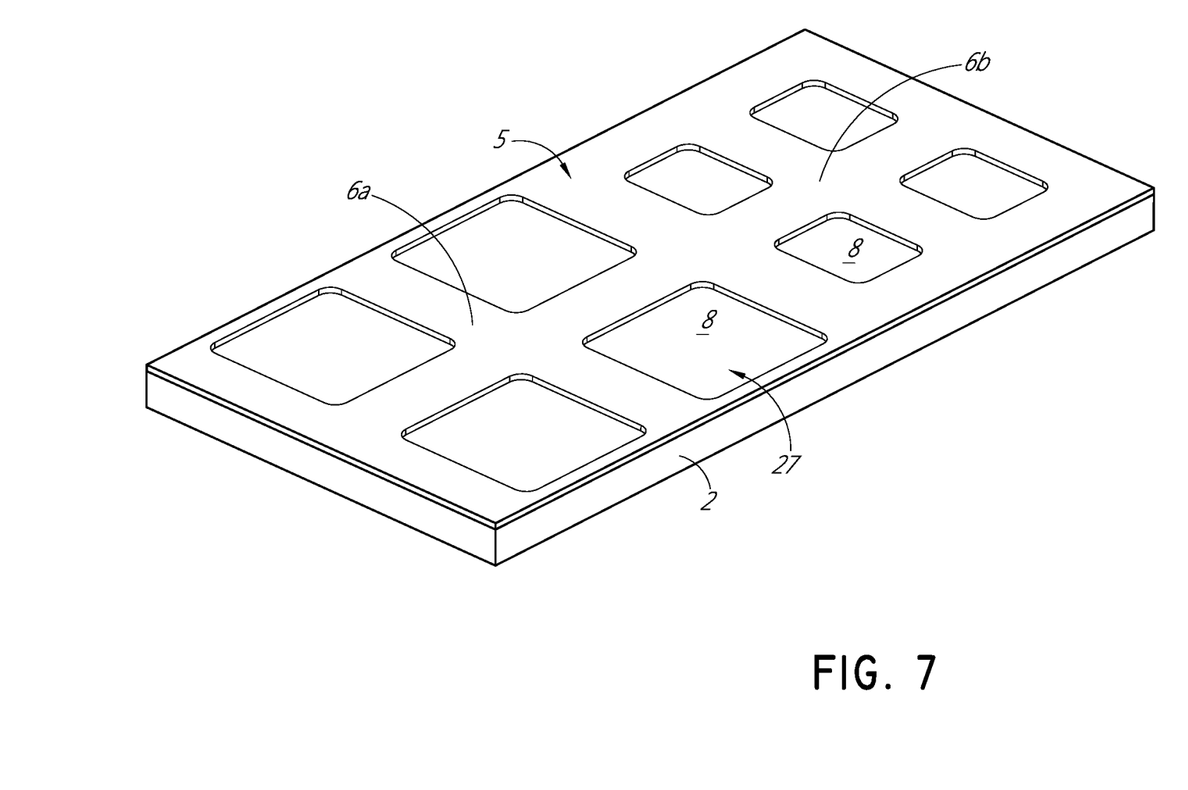
FIGS. 7-9 are schematic perspective views of a first integrated device die having a patterned buffer layer which extends above a recess, according to various embodiments.
Figure 8:
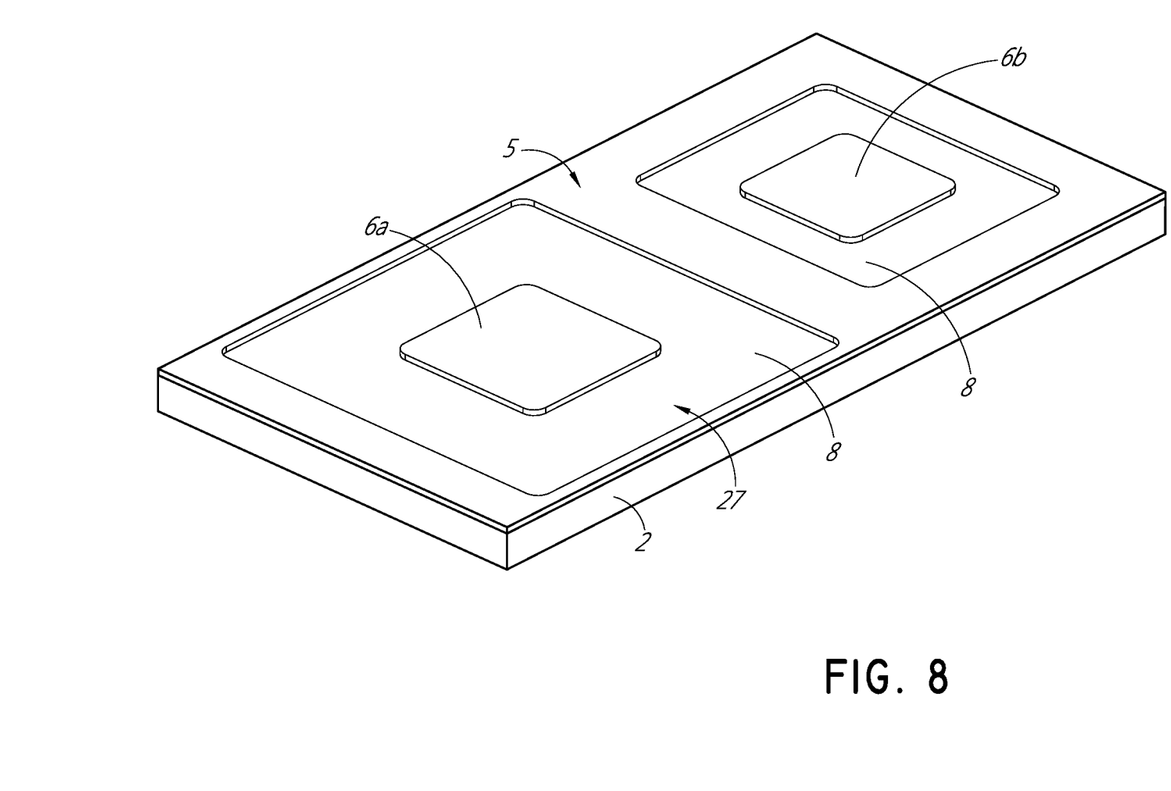
Figure 9:
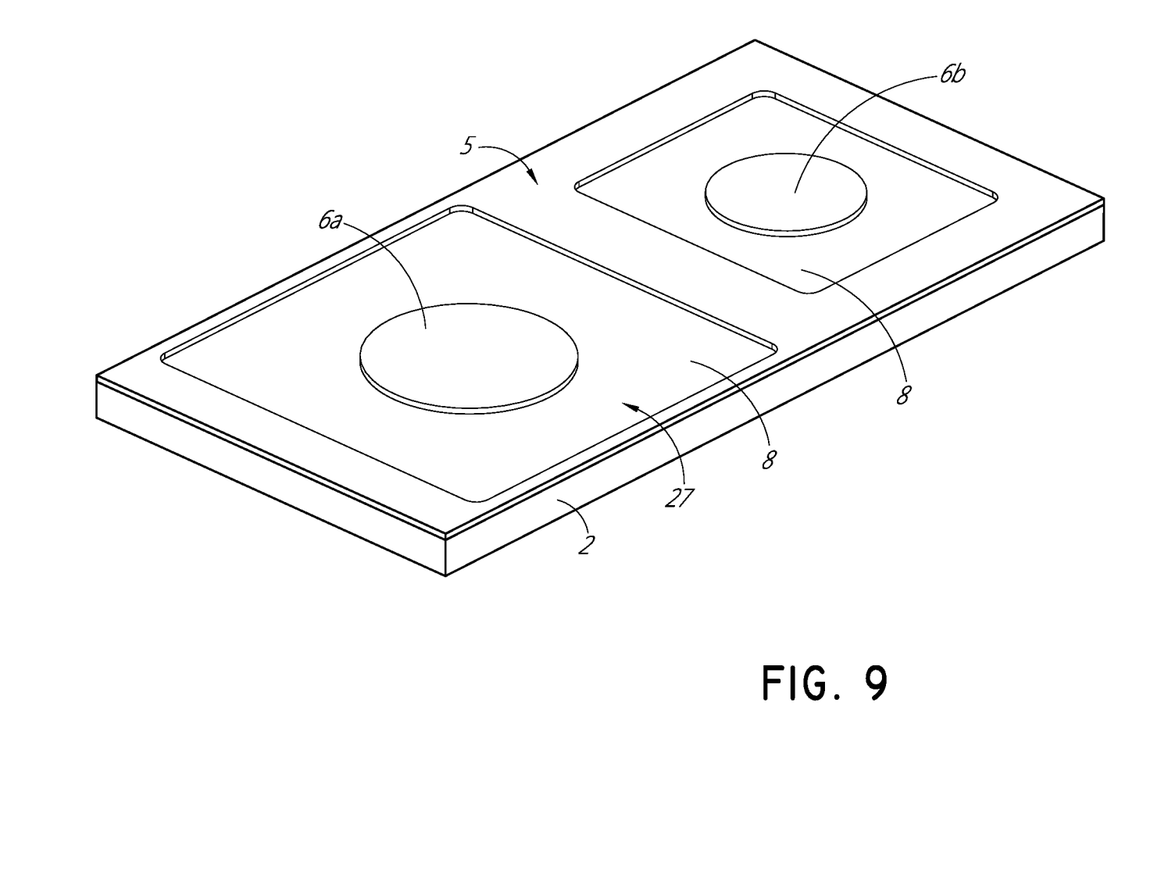

FIGS. 7-9 are schematic perspective views of a first integrated device die 2 having a patterned buffer layer 5 which extends above a recess 27, according to various embodiments. Unless otherwise noted, reference numerals shown in FIGS. 7-9 represent components which are the same as or similar to those shown in FIGS. 1-6B. Unlike the embodiment of FIG. 3, however, the base 8 can define a floor of the recess 27. The recess 27 may be sized and shaped so as to accommodate any excess die attach material 7 (see FIG. 2) which may bleed out after the second die 3 is attached to the first die 2. In the embodiment of FIG. 7, the protrusions 6a, 6b have the shape of a cross, and an uppermost surface of the protrusions 6a, 6b can extend across substantially the entire width of the first die 2. In FIG. 8, the protrusions 6a, 6b can have a polygonal (for example, a four-sided) shape, e.g., a rectangular or square shape. In FIG. 9, the protrusions 6a, 6b can have a rounded shape, e.g., an elliptical or circular shape.

Figure 10:
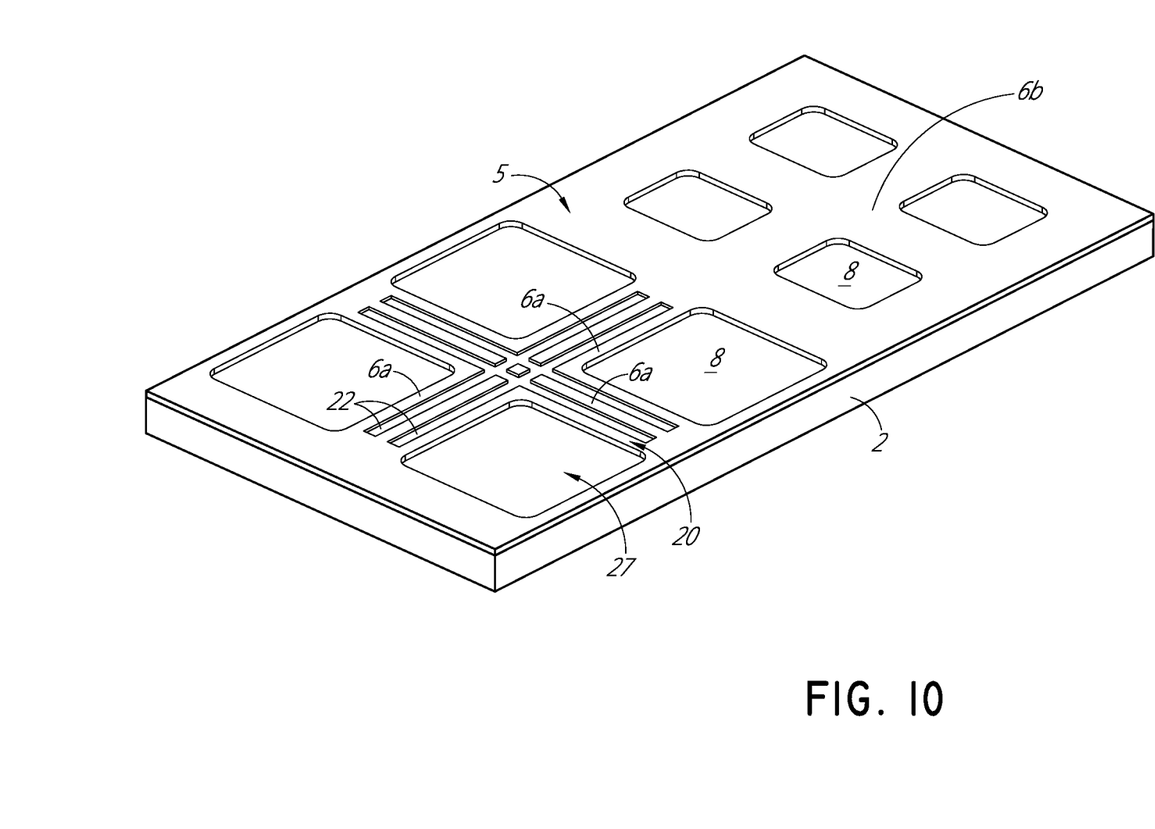
FIG. 10 is a schematic perspective view of a first integrated device die having a buffer layer patterned with multiple closed channels.

FIG. 10 is a schematic perspective view of a first integrated device die 2 having a buffer layer 5 patterned with multiple closed channels 22. Unless otherwise noted, reference numerals shown in FIG. 10 represent components which are the same as or similar to those shown in FIGS. 1-9. For example, in FIG. 10, the protrusion 6a is patterned to have a generally cross-shaped profile in which multiple channels 22 are defined within the protrusion 6a. Thus, in FIG. 10, some portions of the protrusion 6a may act as a dam portion 20 to define the channels 22. Moreover, unlike the embodiment of FIGS. 4A-4B, the channels 22 shown in FIG. 10 are closed channels, in which any bleedout of the die attach material 7 may be contained within the channels 22.

Figure 11:
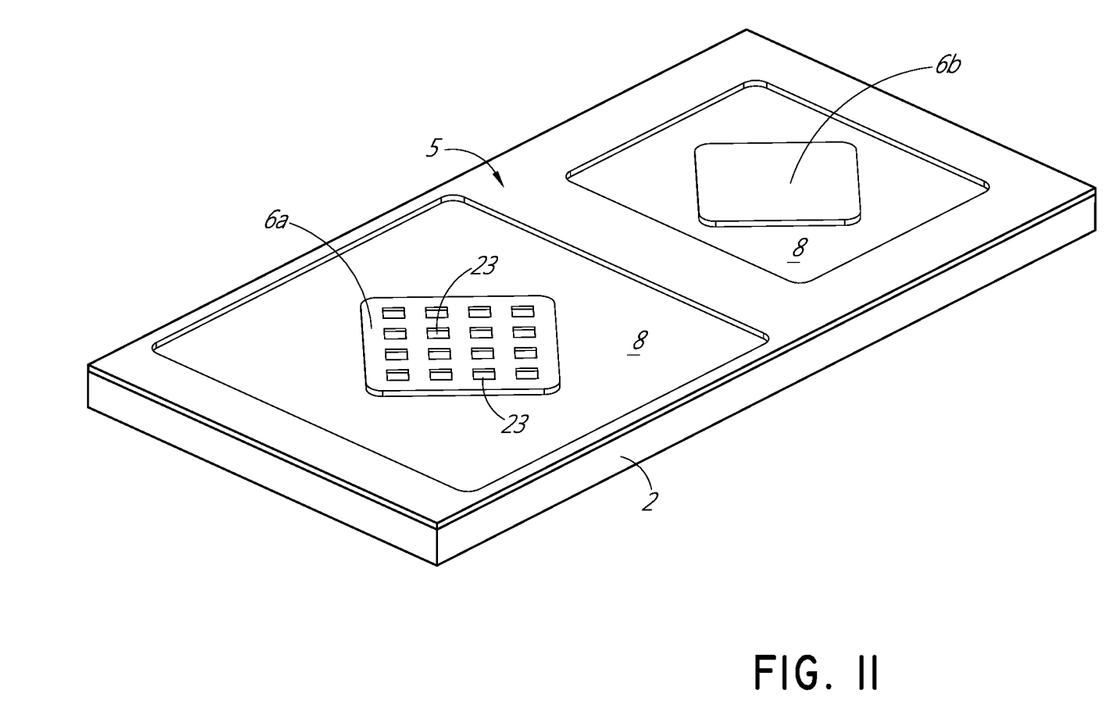
FIG. 11 is a schematic perspective view of a first integrated device die having a buffer layer patterned to have at least one protrusion with a plurality of dimples defined therein.

FIG. 11 is a schematic perspective view of a first integrated device die 2 having a buffer layer 5 patterned to have at least one protrusion 6a with a plurality of dimples 23 defined therein. Unless otherwise noted, reference numerals shown in FIG. 11 represent components which are the same as or similar to those shown in FIGS. 1-10. For example, in FIG. 11, the protrusions 6a, 6b can be shaped such that corner regions of the second and third dies 3, 4 do not contact the buffer layer 5. However, as shown in FIG. 11, dimples 23 can be defined in at least one protrusion 6a. The dimples 23 can comprise a plurality of small recesses or cavities. The dimples 23 can advantageously accommodate at least some excess die attach material 7 (see FIG. 2) which bleeds out after attaching the second die 3 to the buffer layer 5.

With respect to the embodiments of FIGS. 4A-11, it should be appreciated that, although channels 22, dam portions 20, and/or dimples 23 are illustrated only in connection with the protrusion 6a, these features may also be used with the other protrusion 6b.

Advantageously, the embodiments disclosed herein can significantly reduce the stresses transmitted from the first die 2 to the second and/or third dies 3, 4.

Figure 12:
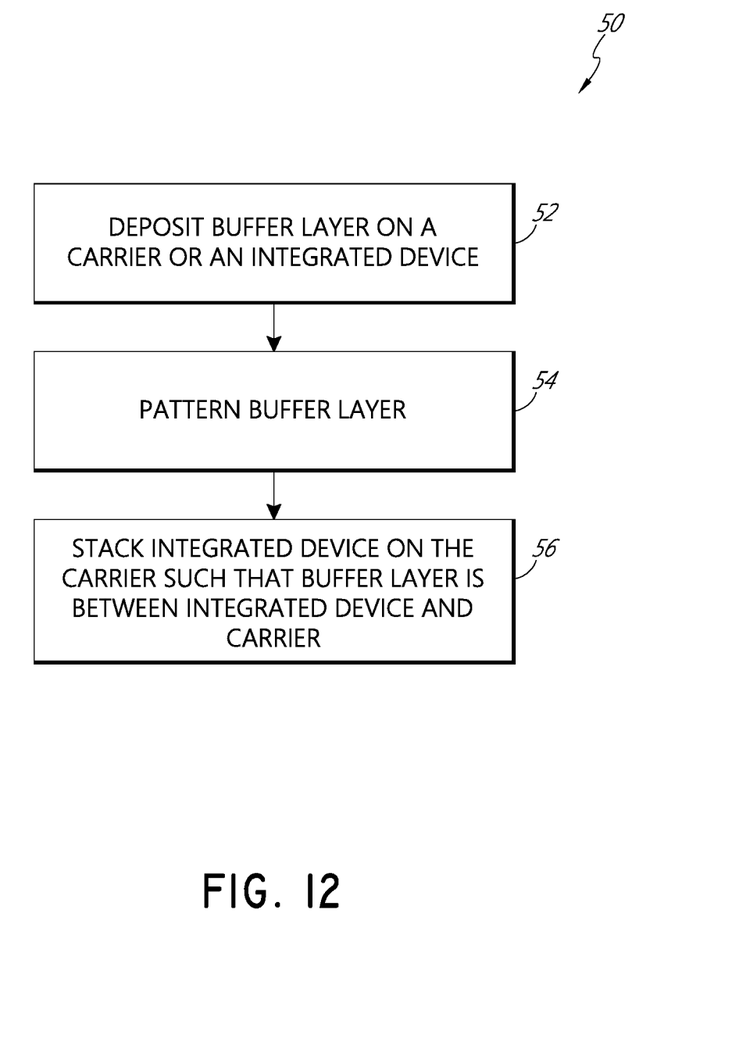
FIG. 12 is a flowchart illustrating a method for manufacturing an integrated device package, according to one embodiment.

FIG. 12 is a flowchart illustrating a method 50 for manufacturing an integrated device package, according to one embodiment. The method 50 can begin in a block 52 to deposit a buffer layer on one of a carrier and an integrated device. As explained above, in some embodiments, the integrated device can comprise a sensitive device, such as an inertial motion sensor, e.g., a MEMS device. The carrier can comprise another integrated device in various embodiments, such as an ASIC (e.g., the first die 2 illustrated herein). In other embodiments, the carrier can comprise a package substrate, such as a plastic substrate, a leadframe, PCB, etc.

Advantageously, the packages disclosed herein can be manufactured using a wafer-level process. For example, in some embodiments, the buffer layer 5 can be applied on a wafer comprising a plurality of device regions (e.g., device regions corresponding to the processing circuitry for the ASIC dies). For example, in some embodiments, the buffer layer 5 can be spin coated onto wafer. The buffer layer 5 can comprise any suitable materials, such as a polymer or metal. For example, in some embodiments, the buffer layer 5 can comprise a compliant polymer material, such as polyimide or polybenzoxazole (PBO). The buffer layer 5 can comprise a plurality of layers, which may be the same as or different from one another. For example, in some embodiments, the buffer layer can have a thickness in a range of 2 microns to 400 microns, e.g., in a range of 35 microns to 300 microns. For polyimide embodiments, formed by spin-on deposition, the selected thickness may be formed, for example, by multiple spin-on coatings. As one example, the buffer layer 5 can have a thickness of about 45 microns, and can be formed of three polymer (e.g., polyimide) layers, a first 5 micron thick layer, a second 20 micron thick layer, and a third 20 micron thick layer. The stress buffer layer 5 can be deposited directly on a passivation layer which covers the active surface of the first integrated device die. The passivation layer is typically an inorganic dielectric, such as silicon oxide, silicon nitride or silicon oxynitride.

Turning to a block 54, the buffer layer 5 can be patterned through at least a portion of a thickness of the buffer layer 5. The buffer layer 5 can also be patterned using wafer-level processes, such as conventional photolithography and etching techniques. For example, a photoresist layer can be applied over the buffer layer 5, which can be formed as a blanket layer across the wafer in which multiple dies (e.g., ASIC dies) are formed. A mask can be applied over the photoresist, and the masked buffer layer can be exposed to light. The photoresist can be developed by a suitable developing agent, and the buffer layer 5 can be etched at least partially (e.g., entirely) through the thickness of the buffer layer 5 to form the desired pattern, e.g., the desired pattern of base 8 and protrusions 6a, 6b such that the protrusions do not cover the entire mounting surface of the integrated device. In some embodiments, the buffer layer 5 can be patterned using a stamping processing, a molding process, and/or any other suitable patterning technique. As explained above, one or more dam portions and channels may also be patterned in the buffer layer. The buffer layer 5 can be cured or hardened using any suitable technique (e.g., applying heat to the wafer). In some embodiments, the buffer layer 5 can be cured after patterning and before singulation of the wafer.

The use of wafer-level processing can advantageously reduce costs as compared with arrangements that utilize separately formed and mounted stress isolation elements. For example, the use of a coated and patterned buffer layer can be significantly less expensive than incorporating an additional silicon interposer. Moreover, the use of wafer-level processes, such as photolithography, can be used to create any desired shape for the pattern in the buffer layer. Wafer-level processes can also improve the alignment of the buffer layer on the first die and/or the alignment of the second die on the buffer layer.

The method 50 moves to a block 56, in which the integrated device is stacked on the carrier such that the buffer layer 5 is disposed between the integrated device and the carrier. In embodiments in which the buffer layer 5 is deposited on the carrier, the integrated device can be adhered to the buffer layer 5 by a suitable adhesive, e.g., a die attach material. In embodiments in which the buffer layer 5 is deposited on the integrated device die, the buffer layer 5 can be adhered to the integrated device by a suitable adhesive such as a die attach material. In some embodiments, the integrated device can be part of a singulated die, such as a MEMS die. In other embodiments, the integrated device can be part of a second wafer which contains a plurality of second integrated devices. The integrated device can be mounted to the buffer layer using a wafer-level process or a package-level process. In a package-level process, individual second dies (such as MEMS dies) can be mounted to the buffer layer either on the wafer (before singulation) or on the singulated first device dies (after singulation). In a wafer-level process, a second wafer comprising second device regions that correspond to the second integrated devices (e.g., MEMS devices) can be attached to the first wafer and the buffer layer using, for example, a wafer bonding process. The wafers can be singulated to form a plurality of stacked devices, and the stacked devices can be mounted to a package substrate.

It should be appreciated that although the illustrated embodiments show the buffer layer as being deposited and patterned to form protrusions on the first die (e.g., the top surface of the ASIC die), in other embodiments, the buffer layer can be deposited and patterned on the second die (e.g., the bottom surface of the MEMS die). In still other embodiments, the buffer layer can be deposited and patterned to form protrusions on a carrier other than the first die, such as a packaging substrate.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
   a carrier formed of a semiconductor material;
   an integrated device die mounted to the carrier;
   a polymer buffer layer disposed between the integrated device die and the carrier, the polymer buffer layer comprising a pattern to reduce transmission of stresses between the carrier and the integrated device die, the pattern defined such that there is a gap between a portion of the integrated device die and a portion of the polymer buffer layer; and
   an adhesive disposed between the integrated device die and the polymer buffer layer to directly mount the integrated device die to the polymer buffer layer with the adhesive.

2. The package of claim 1, wherein the polymer buffer layer coats at least a portion of an exterior surface of the carrier.

3. The package of claim 1, wherein the carrier comprises an additional integrated device die.

4. The package of claim 1, wherein the pattern comprises a base region on the exterior surface of the carrier and one or more protrusions extending from the base region towards the integrated device die, the one or more protrusions covering less than all of an exterior surface of the integrated device die.

5. The package of claim 1, wherein the polymer buffer layer underlies the entirety of the integrated device die.

6. The package of claim 1, wherein the polymer buffer layer is patterned such that the gap is disposed between corner regions of the integrated device die and the polymer buffer layer.

7. The package of claim 1, wherein the integrated device die comprises a microelectromechanical systems (MEMS) device die.

8. The package of claim 1, wherein the pattern comprises one or more protrusions which support the integrated device die and one or more dam portions spaced from the protrusions to form a channel between the protrusions and the dam portions.

9. The package of claim 1, further comprising a package substrate and a package lid mounted to the package substrate, wherein the carrier is mounted to the package substrate, and wherein the carrier and the integrated device die are disposed in a cavity defined by the package lid and the package substrate.

10. The package of claim 1, wherein a thickness of the polymer buffer layer is in a range of 2 microns to 400 microns.

11. The package of claim 1, further comprising a passivation layer between the exterior surface of the carrier and the polymer buffer layer, the polymer buffer layer deposited directly on the passivation layer.

12. The package of claim 1, wherein the polymer buffer layer is spin coated on the exterior surface of the carrier.

13. The package of claim 1, wherein the pattern is etched through at least a portion of the polymer buffer layer.

14. The package of claim 1, wherein the polymer buffer layer contacts between 10% and 40% of an exterior surface of the integrated device die.

15. A method of manufacturing an integrated device package, the method comprising:

depositing a buffer layer on one of a carrier and an integrated device;
patterning the buffer layer through a portion of a thickness of the buffer layer to define a dual thickness for the buffer layer;
mounting the integrated device on the carrier such that the buffer layer is disposed between the carrier and a bottom surface of the integrated device; and
providing electrical communication to the integrated device by way of wire bonds, wherein no electrical connections are located between the bottom surface of the integrated device and a top surface of the carrier.

16. The method of claim 15, wherein depositing the buffer layer comprises depositing the buffer layer on the carrier, the carrier comprising an additional integrated device.

17. The method of claim 15, further comprising applying multiple spin coatings of the buffer layer on a first wafer.

18. The method of claim 15, further comprising etching the buffer layer to define one or more pedestal portions and one or more dam portions spaced apart from the pedestal portions, the dam portions shorter than the pedestal portions.

19. An integrated device package comprising:
a carrier;
an integrated device die mounted to the carrier;
a polymer buffer layer disposed between a bottom surface of the integrated device die and a top surface of the carrier, the polymer buffer layer comprising a pattern to reduce transmission of stresses between the carrier and the integrated device die, the pattern defined such that there is a gap between a portion of the integrated device die and a portion of the polymer buffer layer, wherein electrical communication is provided to the integrated device die by way of wire bonds, and wherein no electrical connections are located between the bottom surface of the integrated device die and the top surface of the carrier; and
an adhesive disposed between the integrated device die and the polymer buffer layer to directly mount the integrated device die to the polymer buffer layer with the adhesive.

20. The integrated device package of claim 19, wherein the polymer buffer layer is deposited on the top surface of the carrier, and wherein the carrier comprises another integrated device die.

* * * * *